United States Patent
Lee et al.

(10) Patent No.: US 11,056,403 B2
(45) Date of Patent: Jul. 6, 2021

(54) WAFER WITH BEVELED EDGE REGION AND METHOD FOR ANALYZING SHAPE OF THE SAME

(71) Applicant: SK SILTRON CO., LTD., Gumi-si (KR)

(72) Inventors: Woo Sung Lee, Gumi-si (KR); Eung Ju Lee, Gumi-si (KR)

(73) Assignee: SK SILTRON CO., LTD., Gyeongsangbuk-Do (KR)

( * ) Notice: Subject to any disclaimer, the term of this patent is extended or adjusted under 35 U.S.C. 154(b) by 80 days.

(21) Appl. No.: 16/173,031

(22) Filed: Oct. 29, 2018

(65) Prior Publication Data

US 2019/0131192 A1    May 2, 2019

(30) Foreign Application Priority Data

Nov. 1, 2017 (KR) .......................... 10-2017-0144952

(51) Int. Cl.
*H01L 21/308* (2006.01)
*H01L 21/66* (2006.01)
(Continued)

(52) U.S. Cl.
CPC ............ *H01L 22/12* (2013.01); *H01L 21/308* (2013.01); *G06T 2207/30148* (2013.01);
(Continued)

(58) Field of Classification Search
CPC ......... H01L 22/12; H01L 22/20; H01L 22/26; H01L 21/308; H01L 21/02035;
(Continued)

(56) References Cited

U.S. PATENT DOCUMENTS 6,361,405 B1 * 3/2002 David ................... B24B 37/042
451/41
2006/0274304 A1 * 12/2006 Haller ..................... H01L 22/12
356/237.1
(Continued)

FOREIGN PATENT DOCUMENTS

JP    H 06-61201    3/1994
JP    2015-232450    12/2015
(Continued)

OTHER PUBLICATIONS

Korean Office Action dated Jun. 12, 2019 issued in Application No. 10-2017-0144952.
(Continued)

*Primary Examiner* — Kyoung Lee
*Assistant Examiner* — Christina A Sylvia
(74) *Attorney, Agent, or Firm* — KED & Associates, LLP

(57) ABSTRACT

Embodiments provide a method of analyzing a shape of a wafer, including: measuring a cross-sectional shape of a plurality of wafers; obtaining a first angle formed by a first line connecting a first point to a second point having a maximum curvature in an edge region of the wafer and a front surface of the wafer; forming a thin film layer on a surface of each of the wafers; measuring a thickness profile of an edge region of the wafer on which each of the thin film layers is formed; and confirming a wafer having a smallest maximum thickness profile of the thin film layer among the plurality of wafers.

4 Claims, 5 Drawing Sheets

(51) Int. Cl.
   *H01L 23/544* (2006.01)
   *H01L 21/02* (2006.01)
(52) U.S. Cl.
   CPC .. *H01L 21/02021* (2013.01); *H01L 21/02035* (2013.01); *H01L 22/20* (2013.01); *H01L 23/544* (2013.01); *H01L 2223/54493* (2013.01)
(58) Field of Classification Search
   CPC ............. H01L 21/02021; H01L 23/544; H01L 2223/54493; G06T 2207/30148
   See application file for complete search history.

(56) References Cited

U.S. PATENT DOCUMENTS

| | | | |
|---|---|---|---|
| 2009/0142916 A1* | 6/2009 | Prenz | H01L 21/02024 438/598 |
| 2016/0314577 A1* | 10/2016 | Lee | G06T 7/60 |
| 2017/0200683 A1* | 7/2017 | Kim | H01L 21/324 |
| 2019/0198613 A1* | 6/2019 | Kim | H01L 29/0661 |

FOREIGN PATENT DOCUMENTS

| | | |
|---|---|---|
| JP | 2017-503164 | 1/2017 |
| JP | 2019-036700 | 3/2019 |
| KR | 10-2006-0038612 | 5/2006 |
| KR | 10-2015-0074370 | 7/2015 |
| WO | WO 2008/093488 | 8/2008 |

OTHER PUBLICATIONS

Japanese Office Action dated Oct. 11, 2019 issued in Application No. 2018-201538.

Japanese Notice of Allowance dated Feb. 12, 2020 issued in Application No. 2018-201538 (English translation attached).

* cited by examiner

WAFER WITH BEVELED EDGE REGION AND METHOD FOR ANALYZING SHAPE OF THE SAME

CROSS-REFERENCE TO RELATED APPLICATIONS

This application claims under 35 U.S.C. § 119 to Korean Patent Application No. 10-2017-0144952, filed in Korea on Nov. 1, 2017, which is hereby incorporated by reference.

TECHNICAL FIELD

Embodiments relate to a wafer and a method of analyzing a shape of the same, and more particularly, to a method of checking a shape of a wafer on which a photoresist or the like is appropriately formed in a wafer fabricating process.

BACKGROUND

Semiconductor devices are formed on a wafer. In this case, in order to achieve high integration and high yields of the semiconductor devices, it is required for an edge of the wafer to have high purity and an appropriate shape suitable for a manufacturing process of the semiconductor device. To this end, a practical and easy method of analyzing a shape of an edge of a wafer is required. For example, one of the most important mathematical parameters of the shape of the edge of the wafer is a curvature, and an overall curvature formed by the edge of the wafer and a front surface of the wafer should be as small as possible. This is because the front surface of the wafer and the edge of the wafer are smoothly formed without a boundary with each other when the curvature is small.

However, when the curvature formed by the edge and the front surface of the wafer is not small, a critical problem in that the wafer may be non-uniformly coated with a photoresist (PR) and the like may occur in a process for manufacturing the semiconductor device on the wafer.

In one conventional method of analyzing a shape of an edge of a wafer, roughness of a surface of the wafer is analyzed through optical principles such as laser scattering and the like. However, in such conventional methods, in order to perform extremely precise analysis corresponding to the calculation of a curvature of the edge, there is a technical burden of a smaller size of a laser spot as well as requiring expensive equipment which is elaborately aligned.

SUMMARY

Embodiments are directed to providing a method of analyzing a shape by measuring a profile of a bevel portion of an edge region of a wafer.

Embodiments are directed to providing a wafer with excellent quality by minimizing a thin film layer remaining after a removal process of a thin film layer.

Embodiments provide a method of analyzing a shape of a wafer including: measuring a cross-sectional shape of a plurality of wafers; obtaining a first angle formed by a first line connecting a first point to a second point having a maximum curvature in an edge region of the wafer and a front surface of the wafer; forming a thin film layer on a surface of each of the wafers; measuring a thickness profile of an edge region of the wafer on which each of the thin film layers is formed; and confirming a wafer having a smallest maximum thickness profile of the thin film layer among the plurality of wafers.

When a height of a bevel portion in the edge region of the wafer is B1, the second point may have a height difference within 10% from the front surface of the wafer.

The second point may be positioned at a distance of 50 to 90 micrometers in a horizontal direction from a start point of the bevel portion of the edge region of the wafer.

When the height of the bevel portion in the edge region of the wafer is B1, the first point may have a height difference within 2.0% from the front surface of the wafer.

In Another embodiment, a wafer including: a bulk region; a front surface and a back surface of the bulk region opposite and parallel to each other; and an edge region disposed at an edge of the bulk region, wherein the edge region includes a bevel portion and an apex of an edge thereof, wherein the bevel portion includes a first point having a maximum curvature and a second point spaced apart in a direction of the apex from the first point, which are disposed in order from the front surface toward the apex, and wherein a first angle formed by a first line connecting the first point to the second point and a front surface of the wafer may be 22 degrees or less.

The first angle formed by the first line connecting the first point to the second point and the front surface of the wafer may be 18 degrees or more.

DETAILED DESCRIPTION OF THE EMBODIMENTS

Hereinafter, embodiments are provided in order to explain the invention in detail, and will be described in detail with reference to accompanying drawings to help understanding of the invention.

However, embodiments according to the present invention may be modified into various other forms, and the scope of the present invention should not be construed as being limited to the embodiments set forth herein. Embodiments of the present invention are provided to more fully explain the present invention to those skilled in the art.

In addition, relational terms such as "first" and "second," "upper" and "lower," and the like, without necessarily requiring or implying any physical or logical relationship or order between its entities or elements, may only be used to distinguish one entity or element from another entity or element.

First, a method of fabricating a wafer according to an embodiment will be described. Specifically, a silicon single crystal substrate is fabricated by a single crystal growing process for fabricating an ingot by the Czochralski method, a slicing process for obtaining a thin disk-shaped wafer by slicing a single crystal ingot, a grinding process for machining an outer circumferential portion of a wafer to prevent cracking and distortion of the wafer obtained by the slicing process, a lapping process for removing damages due to mechanical processing remaining on the wafer, a polishing process for mirror-polishing the wafer, and a cleaning process for removing abrasive or foreign substances adhering to the polished wafer.

In addition, a shape of a wafer is analyzed by a method of analyzing a shape of a wafer according to embodiments. Hereinafter, although an edge of a wafer, among shapes of the wafer such as a wafer edge, a wafer surface, a wafer back surface, and the like which may be acquired as an image, will be described in the embodiments as an example, the present embodiment may also be applied to another shape of the wafer such as the wafer surface, the wafer back surface, and the like other than the wafer edge.

Figure 1:
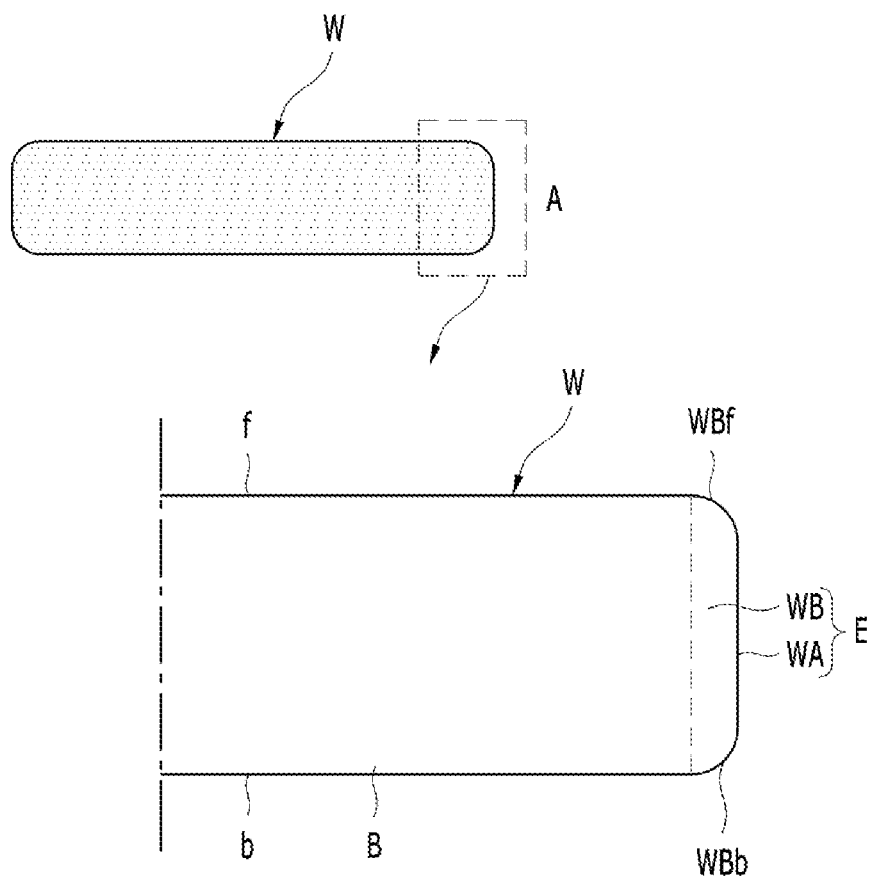
FIGS. 1 and 2 are views showing a wafer of which a shape is analyzed by a method according to an embodiment and enlarged sectional views thereof.
Figure 2:
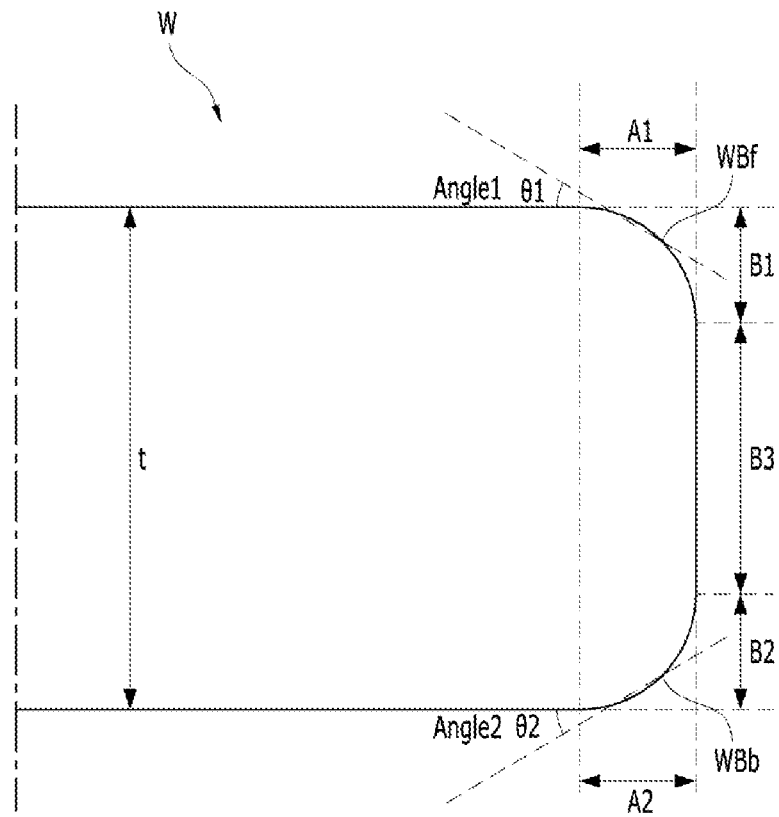

FIGS. 1 and 2 show a wafer of which a shape is analyzed by a method according to an embodiment and enlarged sectional views thereof.

Referring to FIG. 1, a wafer (Wafer, W) may be divided into a bulk region B, a front surface f and a back surface b, and an edge region E disposed at an edge of the bulk region B.

An 'A' region which is a part of the wafer W is shown in detail in FIG. 1.

The bulk region B is a region occupying a majority of the wafer, and an upper surface of the bulk region may be a front surface f and a lower surface may be a back surface b.

In addition, the edge region E may be divided into a bevel portion (WB: Wafer Bevel) and an apex (WA: Wafer Apex). An upper surface of the bevel portion WB may be referred to as a front surface WBf of the bevel portion and a lower surface of the bevel portion WB may be referred to as a back surface WBb of the bevel portion.

In FIG. 2, a thickness of a bulk region of a wafer W may be referred to as 't', a thickness or height of an apex WA may be referred to as 'B3' in an edge region, a height or thickness of a front surface WBf of a bevel portion may be referred to as 'B1', and a height or thickness of a back surface WBb of a bevel portion may be referred to as 'B2'.

In addition, a lateral length or a width of the front surface WBf of the bevel portion may be referred to as 'A1', and a lateral length or a width of the back surface WBb of the bevel portion may be referred to as 'A2'. At this time, sizes of B1 and B2 may be the same, and sizes of A1 and A2 may be the same, but may not necessarily coincide 100% in consideration of an error in a fabricating process.

Further, a first angle (angle 1, θ1) formed by a front surface f of the wafer W and the front surface WBf of the bevel portion and a second angle (angle 2, θ2) formed by a back surface b of the wafer W and the front surface WBf of the bevel portion are shown in FIG. 2. Here, the first angle (angle 1, θ1) and the second angle (angle 2, θ2) may be equal to each other, but may not necessarily coincide 100% in consideration of an error in a fabricating process.

In FIG. 2, a dotted line extending from the front surface WBf and the back surface WBb of the bevel portion of the wafer W may be a tangential line at the front surface WBf and the back surface WBb of the bevel portion of the wafer, respectively. In addition, the tangential line may be a tangential line at a certain point on the front surface WBf and the back surface WBb of the bevel portion of the wafer W, respectively, but may be a tangential line connecting two points, which will be described later in FIGS. 4 to 5.

A cross-sectional shape of a wafer fabricated by the above described process is measured as described below, but a cross-sectional shape of a plurality of wafers may be measured by the same method.

Figure 3:
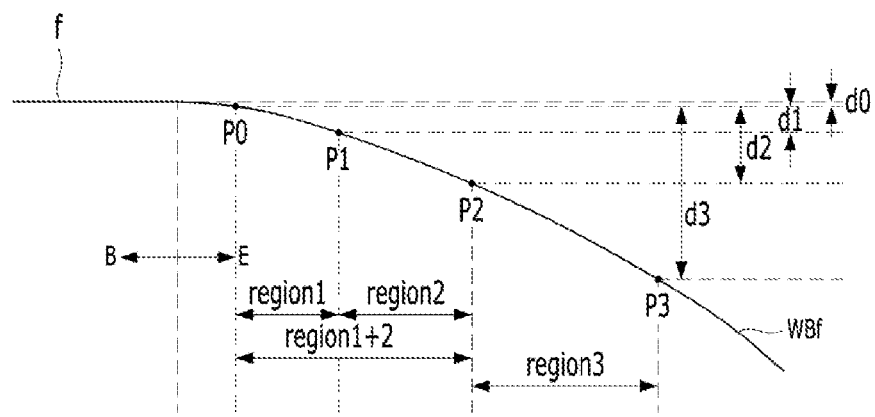
FIG. 3 is a view showing a reference point and first to third points of a bevel portion of a wafer.

FIG. 3 is a view showing a reference point and first to third points of a bevel portion of a wafer.

In FIG. 3, a part of a front surface f of a bulk region B of a wafer and a part of a front surface WBf of a bevel portion of an edge region E are shown. The front surface f of the bulk region B of the wafer may be flat, and a virtual line extended from the front surface f is shown by a dotted line.

The front surface WBf of the bevel portion forms a curved surface in the edge region E, a reference point P0 and first to third points P1, P2, P3 are shown from a point close to the bulk region B at the front surface WBf of the bevel portion in FIG. 3.

A height of the reference point P0 may be disposed substantially at the same height or slightly lower than the front surface f of the bulk region B, and the reference point P0 may be referred to as a starting point of the bevel portion.

In FIG. 2, when the height or thickness of the front surface WBf of the bevel portion is referred to as 'B1', a height difference between the front surface f of the bulk region B and the reference point P0 of the front surface WBf of the bevel portion in FIG. 3, may be close to zero or within 1 micrometer, for example, 0.6 micrometer.

The first point P1 may be a point having a maximum curvature in the front surface WBf of the bevel portion. The point having the maximum curvature may be confirmed by measuring all curvature of each point, or may be a point at which a second differentiation value of a profile of the front surface WBf of the bevel portion becomes maximum.

In FIG. 2, when the height or thickness of the front surface WBf of the bevel portion is referred to as 'B1', a height difference d1 between the front surface f of the bulk region B and the first point P1 of the front surface WBf of the bevel portion in FIG. 3, may be within 2.0% of the 'B1', for example 1.2%.

The second point P2 may be a point adjacent to the first point P1 on the front surface WBf of the bevel portion. In FIG. 2, when the height or thickness of the front surface WBf of the bevel portion is referred to as 'B1', a height difference d2 between the front surface f of the bulk region B and the second point P2 of the front surface WBf of the bevel portion in FIG. 3, may be within 10% of the 'B1'.

The third point P3 may be a point adjacent to the second point P2 on the front surface WBf of the bevel portion. In FIG. 2, when the height or thickness of the front surface WBf of the bevel portion is referred to as 'B1', a height difference d3 between the front surface f of the bulk region B and the third point P3 of the front surface WBf of the bevel portion in FIG. 3, may be within 30% of the 'B1'.

In addition, in FIG. 3, a region between the reference point P0 and the first point P1 in the bevel portion of the edge region E may be referred to as a first region (region 1), a region between the first point P1 and the second point P2 may be referred to as a second region (region 2), and a region between the second point P2 and the third point P3 may be referred to as a third region (region 3).

A lateral distance or a width of the first region (region 1) may be from 10 micrometers to 40 micrometers. A sum of the lateral distances or widths of the first region (region 1) and the second region (region 2) may be 60 micrometers to 90 micrometers.

Figure 4:
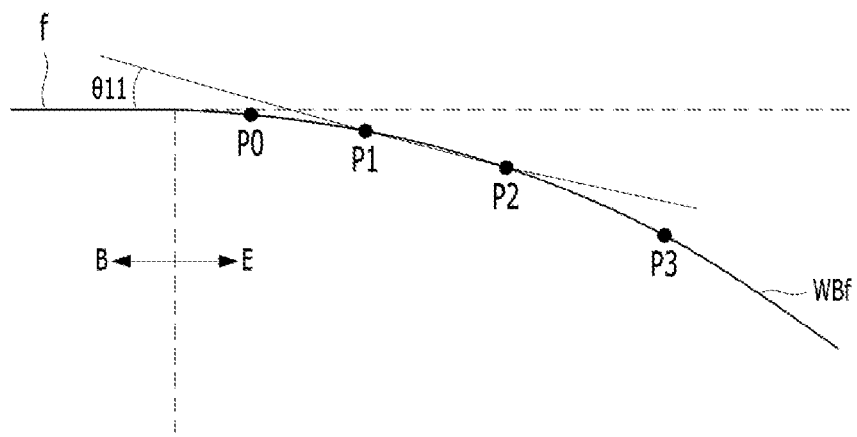
FIG. 4 is a view showing obtaining a first angle of a bevel portion of a wafer.

In FIG. 4, in a front surface WBf of an edge region E of a wafer, a first line connecting a first point P1, which has the smallest curvature radius, that is, the maximum curvature, to a second point P2 is measured and shown. In addition, a first angle θ11 formed by the first line and a front surface f of a bulk region B of the wafer is measured and shown.

Figure 5:
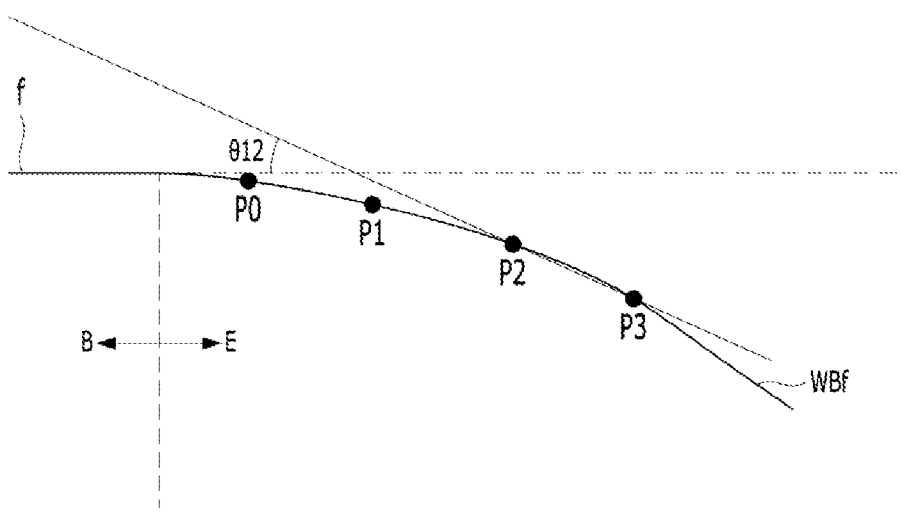
FIG. 5 is a view showing obtaining a second angle of a bevel portion of a wafer.

In FIG. 5, a second line connecting a third point P3 from a second point P2 on a front surface WBf of an edge region E of a wafer is measured and shown. In addition, a second angle θ12 formed by the second line and a front surface f of a bulk region B of the wafer is measured and shown.

In order to avoid confusion with the first angle (angle 1, θ1) and the second angle (angle 2, θ2) in FIG. 2, first and second angles in FIGS. 4 and 5 may be referred to as a first-first angle θ11 and a first-second angle θ12, respectively. The first angle (angle 1, θ1) may be measured in various methods in FIG. 2, and may be measured through the first point P1 and the second point P2 in FIG. 4, and may be measured through the second point P2 and the third point P3 in FIG. 5.

In addition, a thin film layer may be formed on a surface of each wafer by a method such as deposition.

In addition, a thickness profile of an edge region of the wafer on which each of the thin film layers is formed may be measured.

In addition, it is possible to confirm a wafer having the smallest maximum value of the thickness profile of the thin film layer among the plurality of wafers. The thin film layer deposited on a surface of a wafer may show the maximum value of the thickness profile particularly at the bevel portion described above or the front surface of the bulk region adjacent to the bevel portion, and as the maximum value of the thickness profile is relatively small, the quality of a fabricated wafer is excellent, and a possibility of occurrence of a defect of a semiconductor element may be also low.

At this time, it is possible to expect that a shape of the first point P1 having the maximum curvature in the above-described bevel portion has the largest influence on the above-described thickness profile of the thin film layer. However, since it is difficult to accurately measure a gradient of a tangential line at the first point P1, instead, an angle formed by a tangential line and a front surface of a bulk region of a wafer may be obtained by obtaining the tangential line connecting the first point P1 to the second point P2.

In the result of measurement, the tangential line connecting the first point P1 to the second point P2 is obtained, and when a first angle θ11, which is an angle formed by the tangential line and a front surface of a bulk region of a wafer, is 22° or more, it may be confirmed that a thickness of a thin film layer is increased.

In addition, the correlation between the first angle θ11 measured in the second region (region 2) or the second section described above and the thickness of the thin film layer was confirmed.

Figure 6:
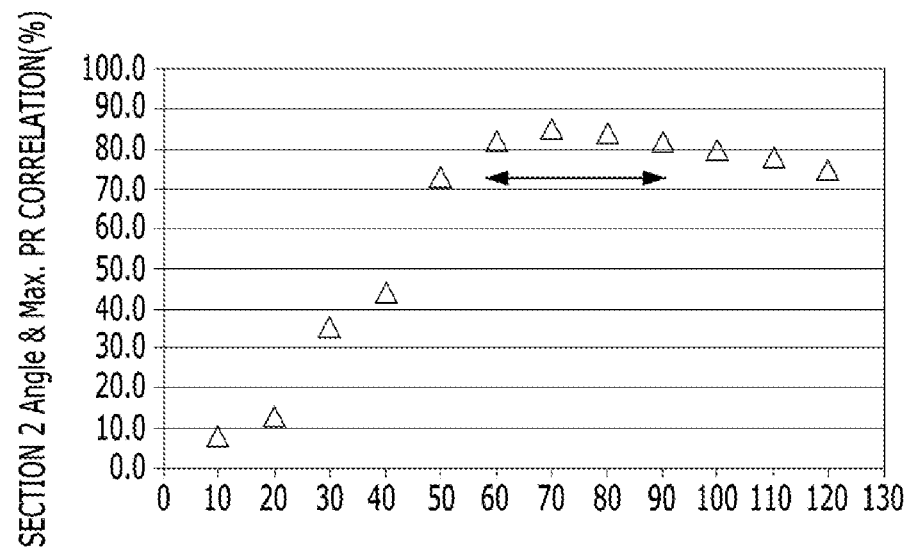
FIG. 6 is a view showing the correlation between a first angle $\theta 11$ measured in a position of a second point P2 and a second section on a F-type substrate and a thickness of a thin film layer.

FIG. 6 shows the correlation between a first angle θ11 measured in a position of a second point P2 and a second section on an F-type substrate and a thickness of a thin film layer.

As shown in FIG. 1 and the like, the F-type substrate may be a wafer in which an apex of a bevel portion of an edge region has a flat shape.

A horizontal axis represents the sum of the lateral distances or widths of the first region (region 1) and the second region (region 2) at the second point P2, and may be a distance of the horizontal direction between the reference point P0 and the second point P2 in FIG. 3.

When the distance from the reference point P0 of the second point P2 is positioned between 60 to 90 micrometers, it may be seen that the correlation between the first angle θ11 measured in the above-described second section and the thickness of the thin film layer is 80% or more.

Figure 7:
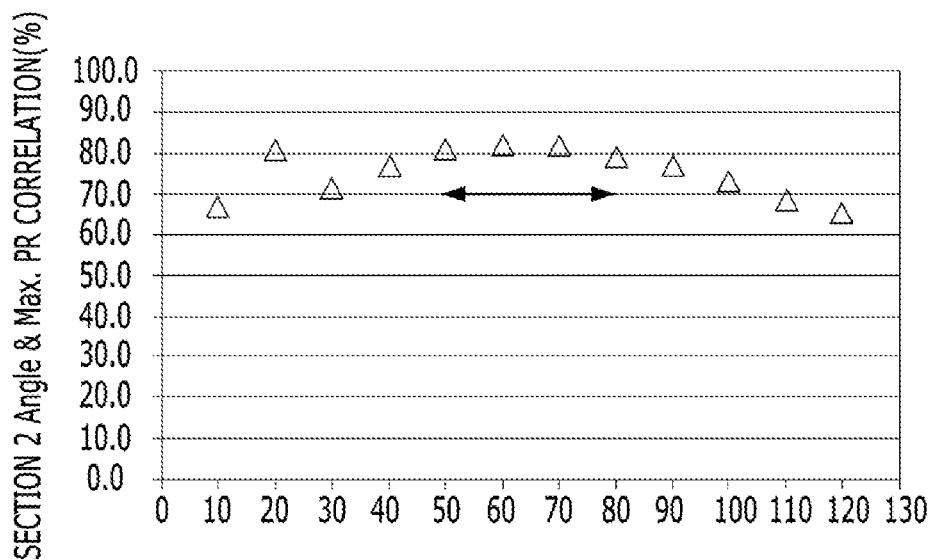
FIG. 7 is a view showing the correlation between a first angle $\theta 11$ measured in a position of a second point P2 and a second section on an R-type substrate and a thickness of a thin film layer.

FIG. 7 shows the correlation between a first angle θ11 measured in a position of a second point P2 and a second section on an R-type substrate and a thickness of a thin film layer.

Unlike what is shown in FIG. 1 and the like, the R-type substrate may be a wafer in which an apex of a bevel portion of an edge region has a round shape.

When the distance from the reference point P0 of the second point P2 is positioned between 50 to 80 micrometers, it may be seen that the correlation between the first angle θ11 measured in the above-described second section and the thickness of the thin film layer is 80% or more.

Figure 8:
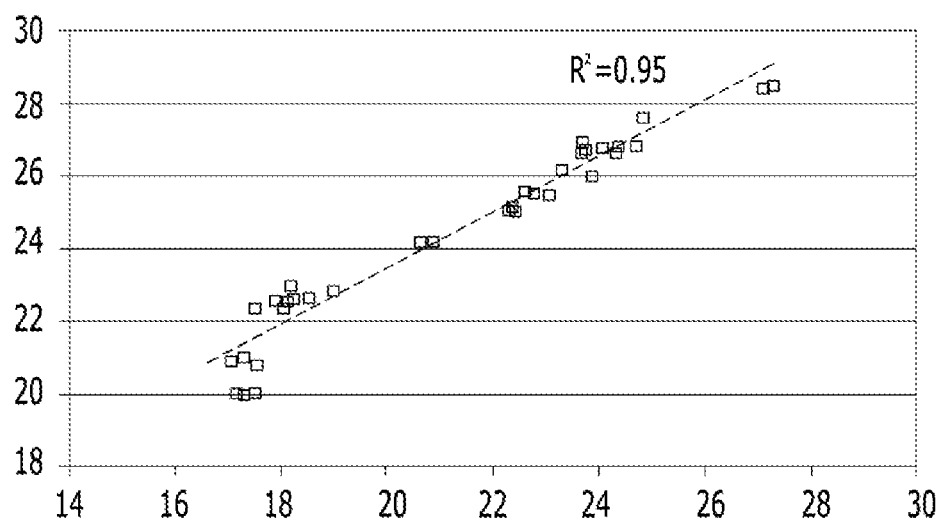
FIG. 8 is a view showing the correlation between the first angle in FIG. 4 and the second angle in FIG. 5.

FIG. 8 shows the correlation between the first angle in FIG. 4 and the second angle in FIG. 5.

In a case in which a second point P2 is disposed at a position of 80 micrometers from a reference point P0 in one wafer, the horizontal axis may show a first angle θ11 and the vertical axis may show a second angle θ12.

In FIG. 8, the correlation between the first and second angles is measured to be about 0.95. In addition, when the magnitude of the first angle θ11 on the horizontal axis is 18 degrees or less, it may be confirmed that the correlation with the thickness of the thin film layer is low.

Therefore, when the first angle θ11, that is, the angle formed by the first line connecting the first point P1 to the second point P2 and the front surface of the bulk region of the wafer is 18° to 22° and the second point P2 is positioned at a distance of 60 to 90 micrometers from the reference point P0, the thickness of the thin film layer, in particular, the maximum value of the thickness becomes small, and therefore, it may be seen that the quality of the wafer is improved.

It may be accomplished by controlling the first angle θ11 through an edge grinding, edge polishing, or double side polishing process in the wafer fabricating process.

When depositing the thin film in a following process by analyzing the shape of the wafer as described above, the wafer which has a thin thickness, in particular, the smallest maximum value of the thickness, may be defined as follows.

The wafer may be provided with front and back surfaces opposite and parallel each other above/below the bulk region, and may be provided with the edge region disposed at the edge of the bulk region. The edge region may include the bevel portion and the apex of the edge thereof, and the bevel portion may include the first point having the maximum curvature and the second point spaced apart in a direction of the apex from the first point, which are disposed in order from the front surface toward the apex.

In addition, the first angle formed by the first line connecting the first point to the second point and the front surface of the wafer may be 18° or more and 22° or less.

At this time, when a height of the bevel portion in the edge region of the wafer is referred to as 'B1', a height difference between the first point and the front surface of the wafer may be within 2.0%.

Figure 9:
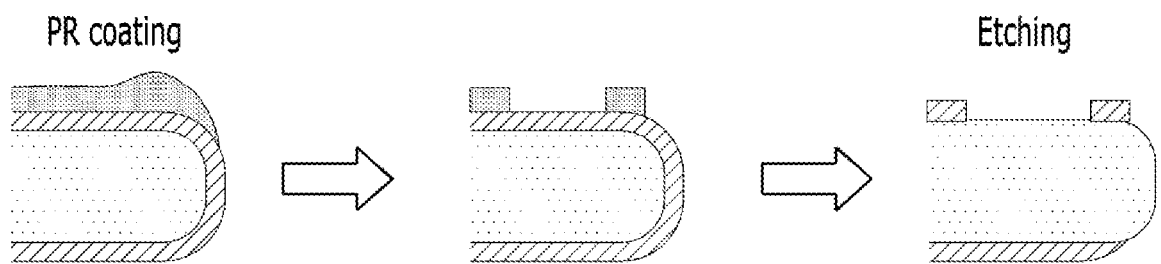
FIG. 9 is a view showing a thin film deposition and etching process of a wafer.

FIG. 9 is a view showing a thin film deposition and etching process of a wafer.

After depositing the thin film layer of the wafer and coating a photoresist (PR), the thin film layer may be removed by a method such as etching. It may be confirmed that a part of the thin film layer remains in a region adjacent to the edge region of the wafer or the bevel portion after the etching process. In the case of the wafer having the profile of the bevel portion described above, the thin film layer remaining in the region adjacent to the edge region or the bevel portion may be minimized.

In a method of analyzing a wafer shape according to the embodiment, it is difficult to accurately measure a gradient of a tangential line at a first point having the maximum curvature in a bevel portion. Instead, a tangential line connecting a first point P1 to a second point P2 is obtained, and when a first angle θ11, which is an angle formed by the tangential line and a front surface of a bulk region of a wafer, is 18° to 22°, it can be confirmed that a thin film layer of the wafer is formed thin.

| DESCRIPTION OF REFERENCE NUMERALS | |
| --- | --- |
| W: wafer | f: front surface |
| b: back surface | B: bulk region |
| E: edge region | WA: apex |
| WB: bevel portion | WBf: front surface of bevel portion |
| WBb: back surface of bevel portion | |

What is claimed is:

1. A wafer comprising:
   a bulk region;
   a front surface and a back surface of the bulk region opposite and parallel to each other; and
   an edge region disposed at an edge of the bulk region,
   wherein the edge region includes a bevel portion and an apex of an edge thereof,
   wherein the bevel portion includes a first point having a maximum curvature and a second point spaced apart in a direction of the apex from the first point, which are disposed in order from the front surface toward the apex,
   wherein a first angle formed by a first line connecting the first point to the second point and a front surface of the wafer is 22 degrees or less, and
   wherein the second point is positioned at a distance of 50 to 90 micrometers in a horizontal direction from a start point of the bevel portion of the edge region of the wafer.

2. The wafer of claim 1, wherein the first angle formed by the first line connecting the first point to the second point and the front surface of the wafer is 18 degrees or more.

3. The wafer of claim 1, wherein the bevel portion in the edge region of the wafer has a height, and the second point has a height difference within 10% from the front surface of the wafer.

4. The wafer of claim 1, wherein the bevel portion in the edge region of the wafer has a height, and the first point has a height difference within 2.0% from the front surface of the wafer.

* * * * *